US007361597B2

(12) United States Patent
Ban

(10) Patent No.: US 7,361,597 B2
(45) Date of Patent: Apr. 22, 2008

(54) SEMICONDUCTOR DEVICE AND METHOD OF FABRICATING THE SAME

(75) Inventor: Sang Hyun Ban, Seongnam-si (KR)

(73) Assignee: Dongbu Hitek Co., Ltd., Seoul (KR)

( * ) Notice: Subject to any disclaimer, the term of this patent is extended or adjusted under 35 U.S.C. 154(b) by 62 days.

(21) Appl. No.: 11/473,692

(22) Filed: Jun. 23, 2006

(65) Prior Publication Data

US 2006/0292807 A1 Dec. 28, 2006

(30) Foreign Application Priority Data

Jun. 27, 2005 (KR) ...................... 10-2005-0055585

(51) Int. Cl.
*H01L 21/4763* (2006.01)
*H01L 21/44* (2006.01)

(52) U.S. Cl. ...................... 438/682; 438/589; 438/597; 438/630; 438/649; 438/664; 257/754; 257/E21.165; 257/E21.166; 257/E21.199

(58) Field of Classification Search ................ 438/682, 438/589, 597, 630, 649, 655, 664; 257/754, 257/E21.199, E21.165, E21.166
See application file for complete search history.

(56) References Cited

U.S. PATENT DOCUMENTS 5,950,098 A * 9/1999 Oda et al. .................... 438/527
7,270,623 B2 * 9/2007 Wang .......................... 477/96

* cited by examiner

*Primary Examiner*—Michael Lebentritt
*Assistant Examiner*—Mohsen Ahmadi
(74) *Attorney, Agent, or Firm*—Saliwanchik, Lloyd & Saliwanchik

(57) ABSTRACT

A semiconductor device incorporating an alloy layer formed on a substrate; a gate electrode, a source electrode, and a drain electrode formed on the alloy layer at predetermined intervals therebetween; a gate insulating layer formed on the gate electrode in a gate electrode region; a first conductive layer formed on the substrate, including the source electrode and the drain electrode; and a second conductive layer and a metal silicide layer sequentially stacked on the first conductive layer and gate insulating layer.

15 Claims, 8 Drawing Sheets

150 131 150 200 170 190 190 150 150 110 122 121 123 100

SEMICONDUCTOR DEVICE AND METHOD OF FABRICATING THE SAME

RELATED APPLICATION

This application claims the benefit under 35 U.S.C. §119 (e) of Korean Patent Application Number 10-2005-0055585, filed Jun. 27, 2005, which is incorporated herein by reference in its entirety.

FIELD OF THE INVENTION

The present invention relates to a semiconductor device and a method of fabricating the same, and particularly, to a semiconductor device with improved properties and a method of fabricating the same.

BACKGROUND OF THE INVENTION

In general, as semiconductor devices become geometrically smaller, gate, source and drain regions are decreasing in size and the junction between the source region and the drain region needs to be shallower. However, for these reasons, undesirable high-resistance regions are generated.

Therefore, to reduce the resistance between the source and drain regions and a polycrystalline silicon region, a high melting point metal silicide is used on contacts between those regions.

Accordingly, whenever contacts between the source and drain regions and exposed silicon occur during processes, a thin film of high melting point metal is deposited and heated to form a silicide. In this process, various silicide compounds including platinum, manganese, cobalt, or titanium are used.

A method of fabricating a prior art semiconductor device will now be described referring to accompanying drawings.

FIGS. 1A to 1F are cross-sectional views illustrating a method of fabricating the prior art semiconductor device.

As shown in FIG. 1A, device isolation layers 22 are formed in the device isolation regions of a semiconductor substrate 21 having active regions and device isolation regions. The device isolation layers 22 are generally formed through a local oxidation of silicon (LOCOS) or shallow trench isolation (STI) process.

Then, the semiconductor substrate 21 is thermally oxidized at a high temperature to form a gate oxidation layer 23 on the semiconductor substrate 21.

A channel region of a transistor is formed by selectively implanting n-type or p-type impurity ions into the active region of the semiconductor substrate 21 to form an n-well or p-well (not shown). A thermal process is then performed thereon at a high temperature of about 1050~1200° C.

Then, a polysilicon layer is deposited on the gate oxidation layer 23. The polysilicon layer and the gate oxidation layer 23 are selectively etched through a photolithography process to form a gate electrode 24.

As shown in FIG. 1B, n-type impurity ions or p-type impurity ions are implanted into the surface of the semiconductor substrate 21, using the gate electrode 24 as a mask, to form lightly doped drain (LDD) regions 25 at both sides of the gate electrode 24 in the surface of the semiconductor substrate 21.

As shown in FIG. 1C, an insulating layer is deposited on the surface of the semiconductor substrate 21 by a low pressure chemical vapor deposition (LPCVP) method; and an etch-back process is performed on the entire surface thereof to form insulating layer sidewalls 26 at both sides of the gate electrode 24.

Then, n-type or p-type impurity ions are implanted at high concentration into the surface of the semiconductor substrate 21, using the gate electrode 24 and the insulating layer sidewalls 26 as a mask, to form source-drain impurity regions 27 at both sides of the gate electrode 24 in the surface of the semiconductor substrate 21. A thermal process is then performed thereon at a temperature of about 1000~1050° C.

Subsequently, a washing process is performed to remove from the semiconductor substrate 21 various target materials such as metal impurities, organic contaminants, and/or a natural oxidation layer.

Referring to FIG. 1D, the semiconductor substrate 21 having passed through the washing process is transferred to a sputter chamber (not shown) of sputtering equipment, and a metal layer 28 of, for example, cobalt, is sputtered and formed on the entire surface of the semiconductor substrate 21.

As shown in FIG. 1E, the semiconductor substrate 21 is then passed into rapid thermal process (RTP) equipment or an electric furnace, and is thermally processed at a temperature of 400~600° C. to form a metal silicide layer 29 on the surface of the semiconductor substrate 21 including the gate electrode 24 and the source and drain impurity regions 27.

In particular, during the thermal process, silicon ions of the gate electrode 24 and the semiconductor substrate 21 react with metal ions of the metal layer 28, thereby forming the metal silicide layer 29. However, such a reaction does not occur in the insulating layer sidewalls 26 or the device isolation layers 22, and thus the metal layer 28 still remains thereon.

As shown in FIG. 1F, the remaining metal layer 28 on the insulating layer sidewalls 26 and the device isolation layers 22 is removed. Then the semiconductor substrate 21 is annealed at a predetermined temperature to stabilize a phase of the metal silicide layer 29, thereby completing a low-resistance metal silicide layer 29.

However, the related art method of fabricating a semiconductor device has the following problems.

That is, even though a polysilicon gate is advantageous for high-temperature processes, has excellent compatibility throughout the entire process, and shows excellent electrical properties after completion of device fabrication, high resistance occurs due to a super-high integration and a size decrease of the device. Moreover, the oxidation layer increases in thickness due to gate depletion, and the fluctuation of a threshold voltage occurs because of diffusion of dopants in the polysilicon gate.

SUMMARY OF THE INVENTION

Accordingly, the present invention is directed to a semiconductor device and a method of fabricating the same that addresses and/or substantially obviates one or more problems, limitations, and/or disadvantages of the prior art.

An object of the present invention is to provide a semiconductor device and a method of fabricating the same capable of scaling down while preventing gate depletion and impurity diffusion.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided a semiconductor device incorporating: an alloy layer formed on a substrate; a gate electrode, a source electrode, and a drain electrode formed on the alloy layer at predetermined intervals therebetween; a gate insulating layer formed in a gate electrode region; a first conductive layer formed on the substrate, the source electrode, and the drain electrode; and a second conductive layer and a metal silicide layer sequentially stacked on the first conductive layer.

In another aspect of the present invention, there is provided a method of fabricating a semiconductor device, the method including: forming an alloy layer on a substrate; forming a source electrode, a drain electrode and a gate electrode on the alloy layer at predetermined intervals therebetween; forming a gate insulating layer on a surface of the gate electrode; forming a first conductive layer on the resulting substrate; planarizing the first conductive layer to expose a top surface of the gate insulating layer; forming a second conductive layer above the substrate; selectively forming source and drain impurity regions in the first and second conductive layers; and forming a metal silicide layer on the second conductive layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1A:
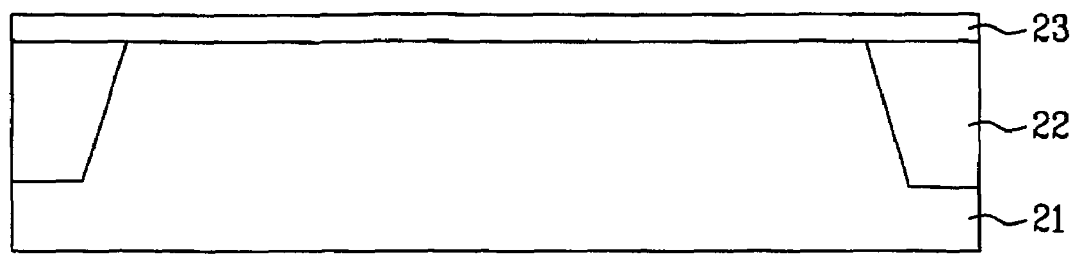
FIGS. 1A to 1F are cross-sectional views illustrating a method of fabricating the prior art semiconductor device.
Figure 1B:
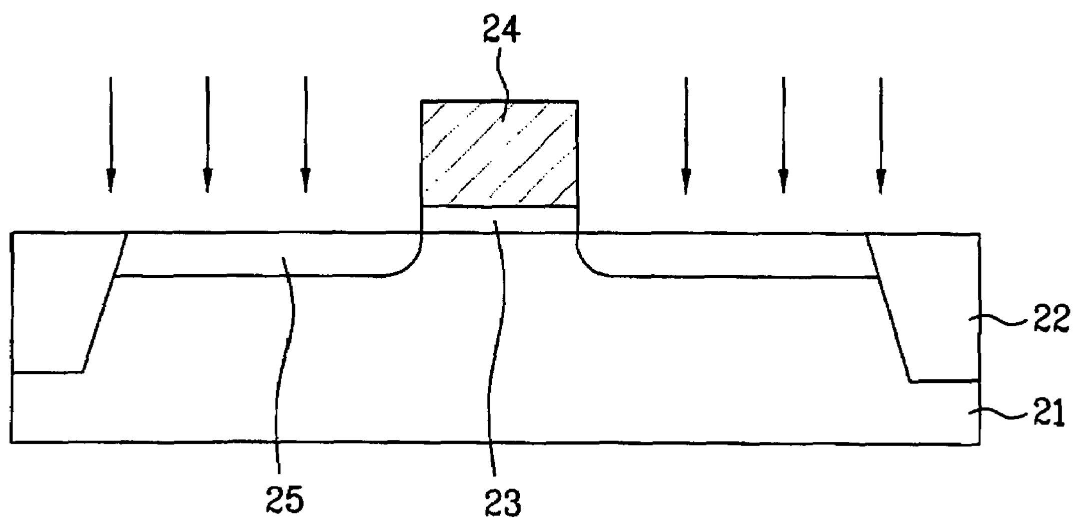
Figure 1C:
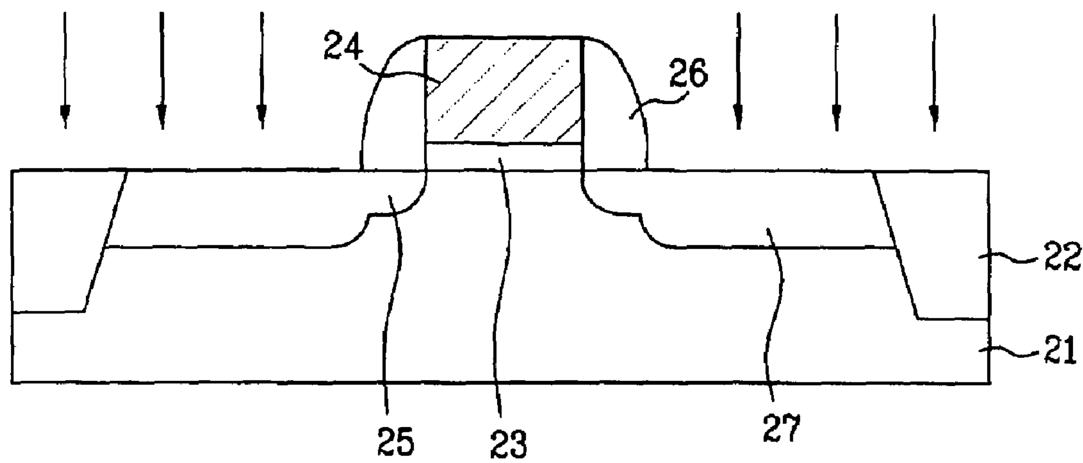
Figure 1D:
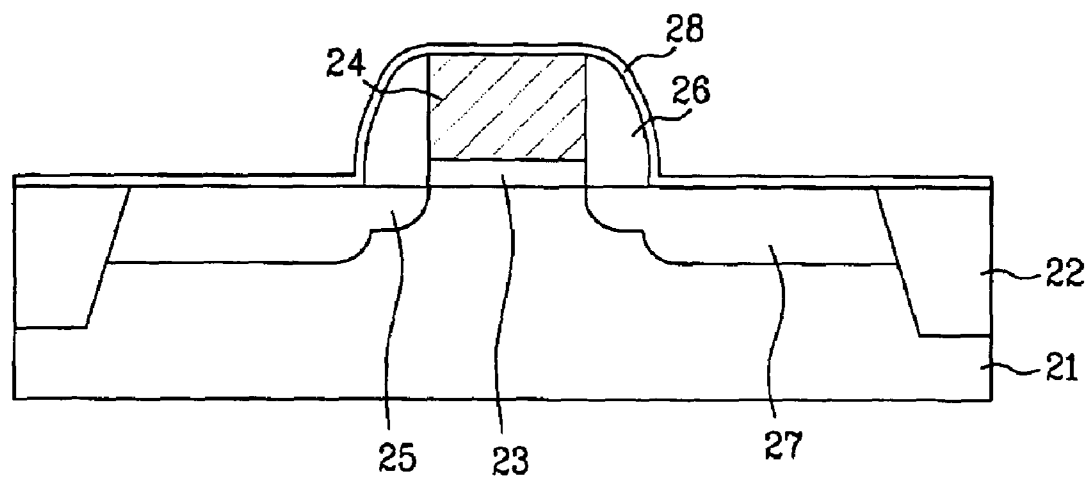
Figure 1E:
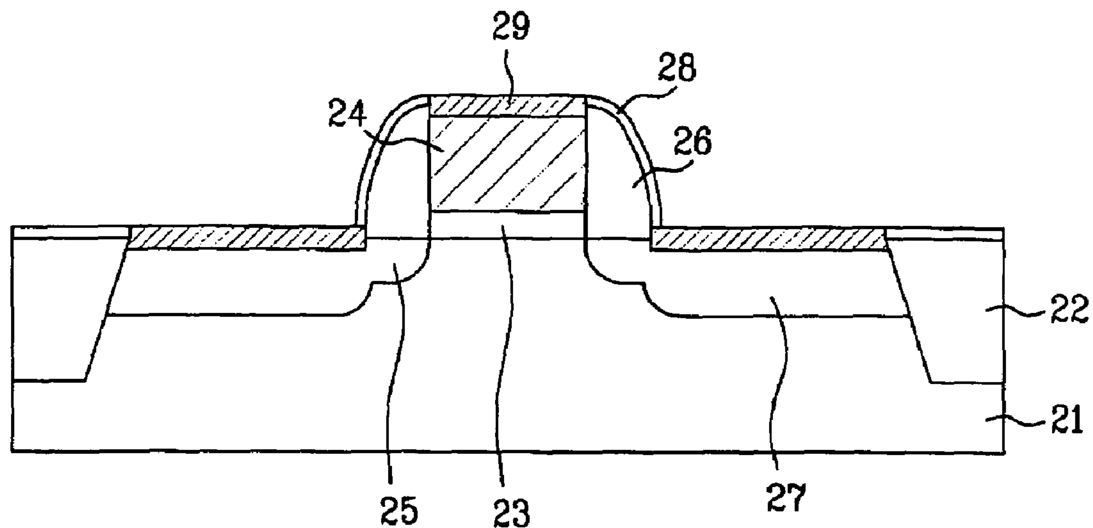
Figure 1F:
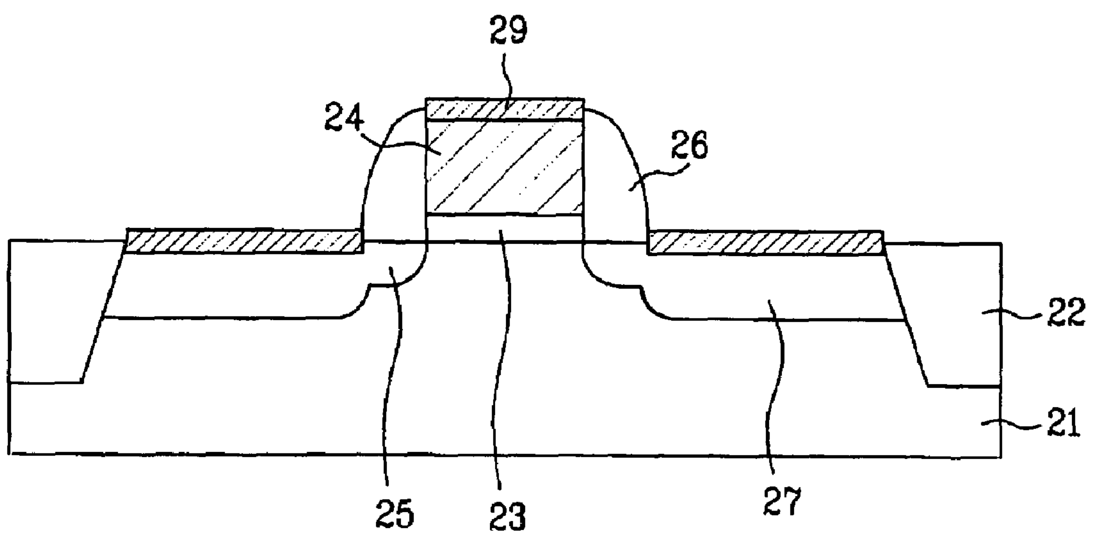
Figure 2:
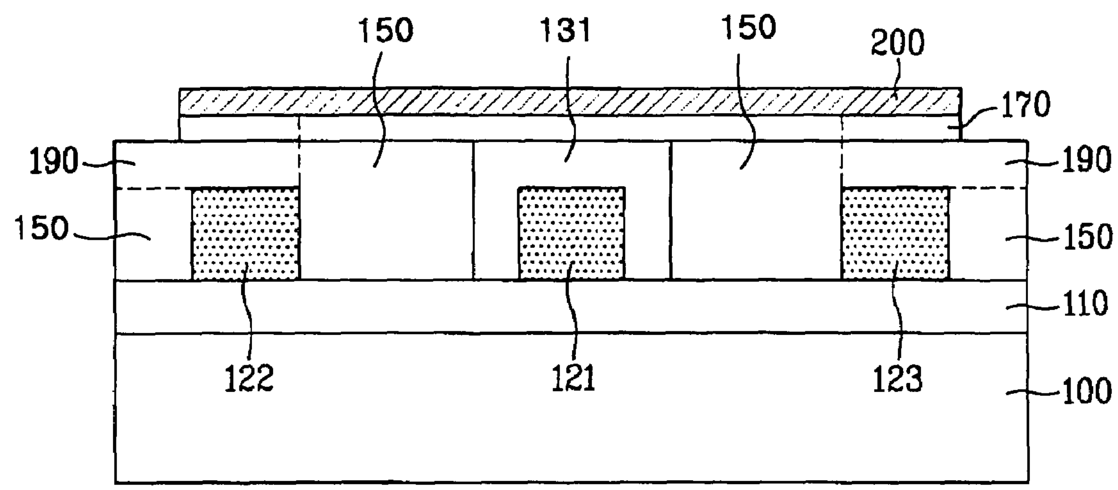
FIG. 2 is a cross-sectional view illustrating a semiconductor device according to an embodiment of the present invention.

FIG. 2 is a cross-sectional view illustrating a gate electrode of a semiconductor device according to an embodiment of the present invention.

Referring to FIG. 2, a poly-germanium-carbon alloy layer 110 can be formed on a silicon substrate 100. A source electrode 122 and a drain electrode 123 can be formed at a predetermined interval on the poly-germanium-carbon alloy layer 110 with a gate electrode 121 formed therebetween. A gate insulating layer 131 of a high-K dielectric layer can be formed on a surface of the gate electrode 121. In one embodiment, the gate insulating layer 131 can be formed on all exposed surfaces of the gate electrode such that the gate insulating layer is on the gate electrode and an area peripheral to the gate electrode. A first polysilicon layer 150 can be formed on the silicon substrate 100, the source electrode 122, and the drain electrode 123. A second polysilicon layer 170 and a metal silicide layer 200 can be sequentially stacked on the first polysilicon layer 150 and the top surface of the gate insulating layer 131. Source and drain impurity regions 190 can be formed in the first polysilicon layer 150 and the second polysilicon layer 170 above the source electrode 122 and the drain electrode 123.

In a specific embodiment, the metal silicide layer 200 can be formed of tungsten silicide, cobalt silicide, titanium silicide, or tantalum silicide. As shown in FIG. 2, the first polysilicon layer 150 can be formed to a height as high as the top surface of the gate insulating layer 131.

FIGS. 3A to 3I are cross-sectional views illustrating a method of fabricating a semiconductor device according to embodiments of the present invention.

Figure 3A:
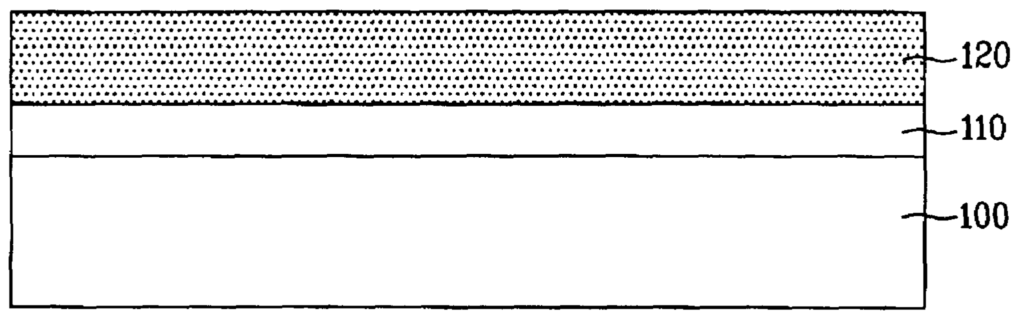
FIGS. 3A to 3I are cross-sectional views illustrating a method of fabricating a semiconductor device according to embodiments of the present invention.

As shown in FIG. 3A, a poly-germanium-carbon (poly-$Ge_{1-X}C_X$) alloy layer 110 can be formed on a silicon substrate 100. The poly-germanium-carbon (poly-$Ge_{1-X}C_X$) alloy can be formed by adding carbon to poly-germanium (poly-Ge).

Then, a metal layer 120 can be deposited on the poly-germanium-carbon alloy layer 110. In a specific embodiment, the metal layer 120 can be a conductive metal such as aluminum (Al), aluminum alloy (AlNd), chrome (Cr), or molybdenum (Mo).

Figure 3B:
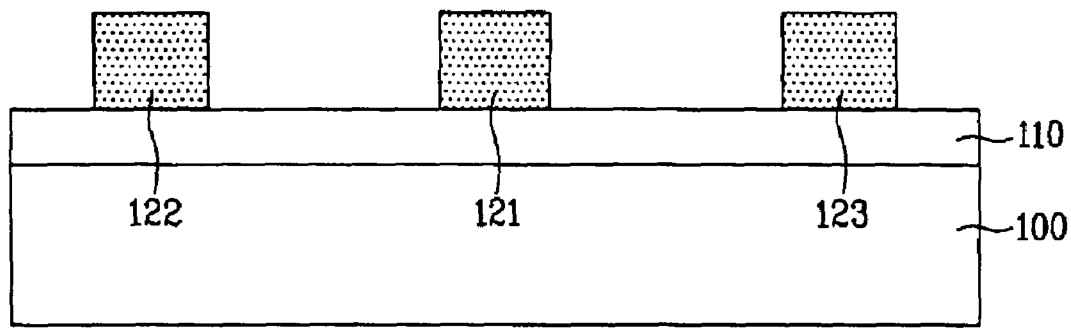

As shown in FIG. 3B, the metal layer 120 can be selectively removed to form a gate electrode 121, source electrode 122, and drain electrode 123. In one embodiment, the metal layer 120 can be selectively removed by using a photolithography process.

Figure 3C:
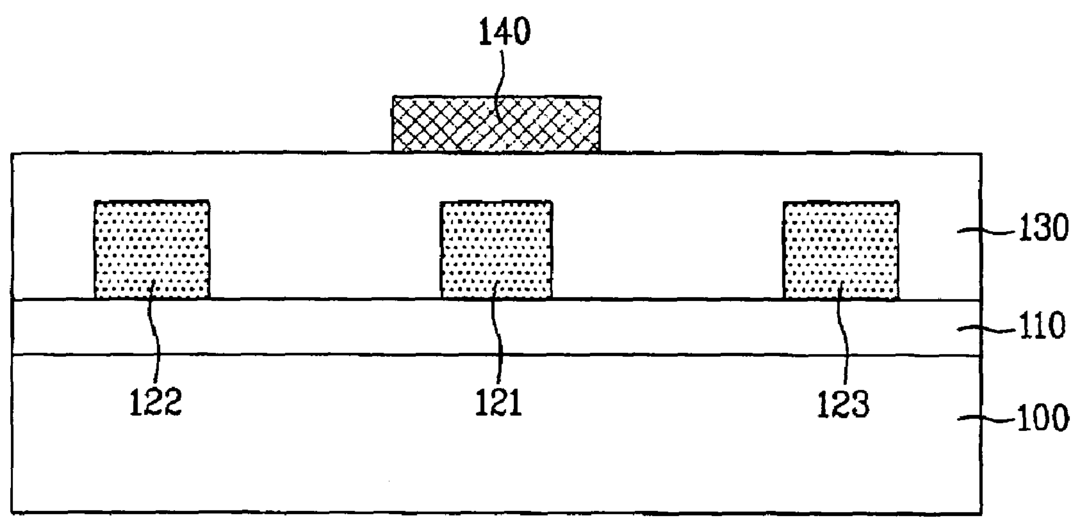

As shown in FIG. 3C, a high-K dielectric layer 130 can be formed on the entire surface of the silicon substrate 100, including the gate electrode 121, the source electrode 122, and the drain electrode 123.

Then, a first hard mask layer 140 can be formed on the high-K dielectric layer 130. In one embodiment the first hard mask layer 140 can be formed by depositing a layer of an oxide or a nitride on the high-K dielectric layer 130, and selectively removing the oxide layer or nitride layer through a photolithography process so as to remain only in a region above the gate electrode 121. In one embodiment, the hard mask layer 140 can remain on the high-K dielectric layer 130 above the gate electrode 121 and its peripheral portions such that the hard mask layer 140 extends a distance around the gate electrode 121.

Figure 3D:
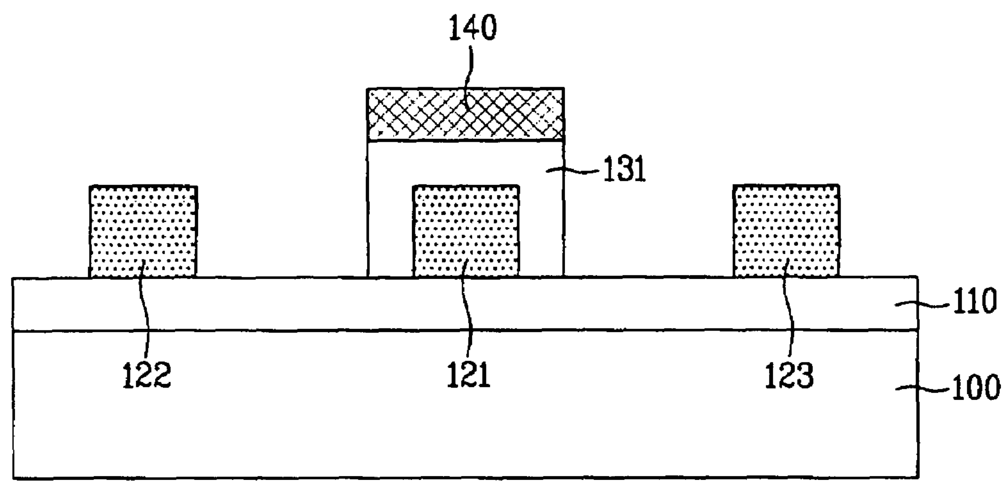

As shown in FIG. 3D, the high-K dielectric layer 130 can be selectively removed by using the first hard mask layer 140 as a mask to form a gate insulating layer 131 encompassing the gate electrode 121.

Figure 3E:
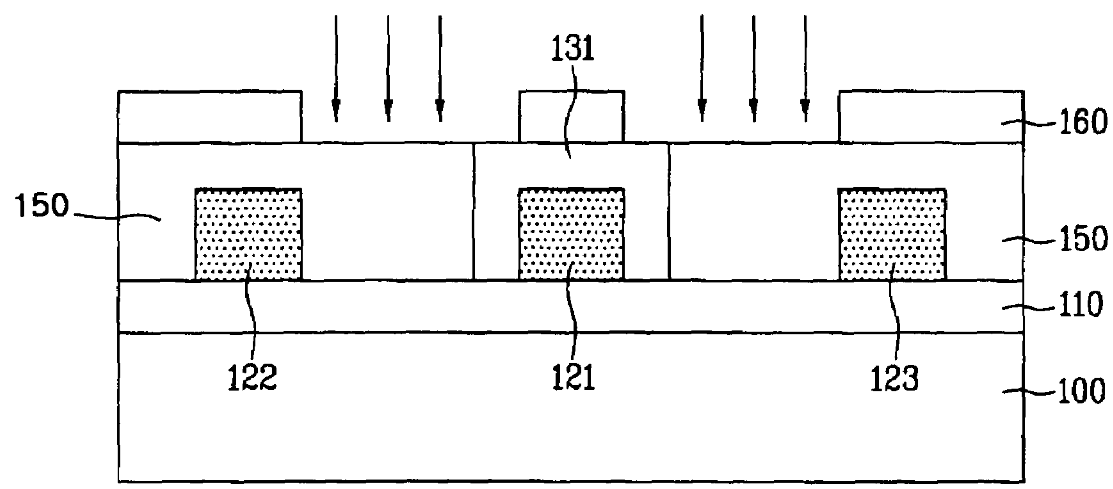

As illustrated in FIG. 3E, once the first hard mask layer 140 is removed, a first polysilicon layer 150 can be deposited on the resulting substrate.

In an embodiment, a chemical mechanical polishing (CMP) process can be performed on the first polysilicon layer 150, using a top surface of the gate insulating layer 131 as an end point of the process.

A first photoresist 160 can be coated onto the surface of the silicon substrate 100, and can be selectively patterned by exposing and developing processes to define a channel region.

Then, channel ions can be implanted into the exposed first polysilicon layer 150 using the patterned first photoresist 160 as a mask.

Figure 3F:
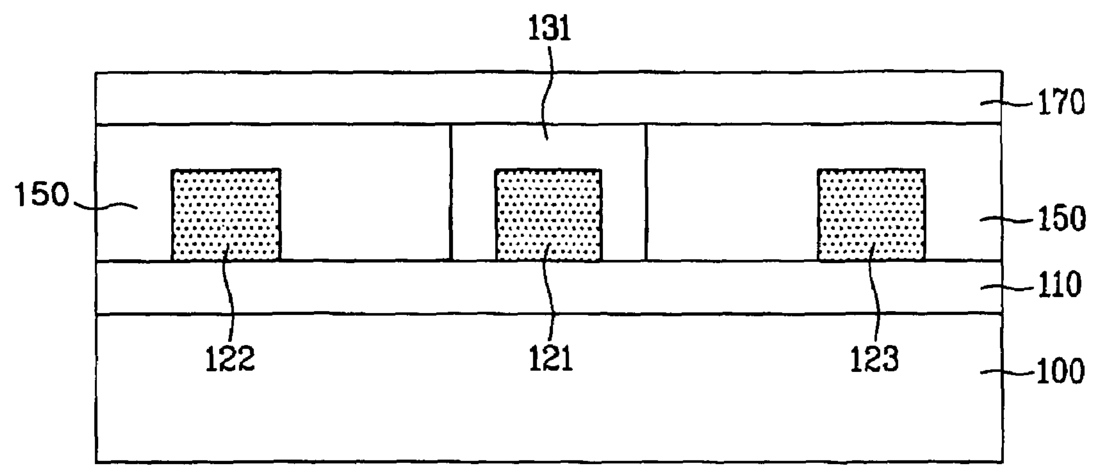

As shown in FIG. 3F, once the first photoresist 160 is removed, a second polysilicon layer 170 can be deposited on the resulting substrate.

Figure 3G:
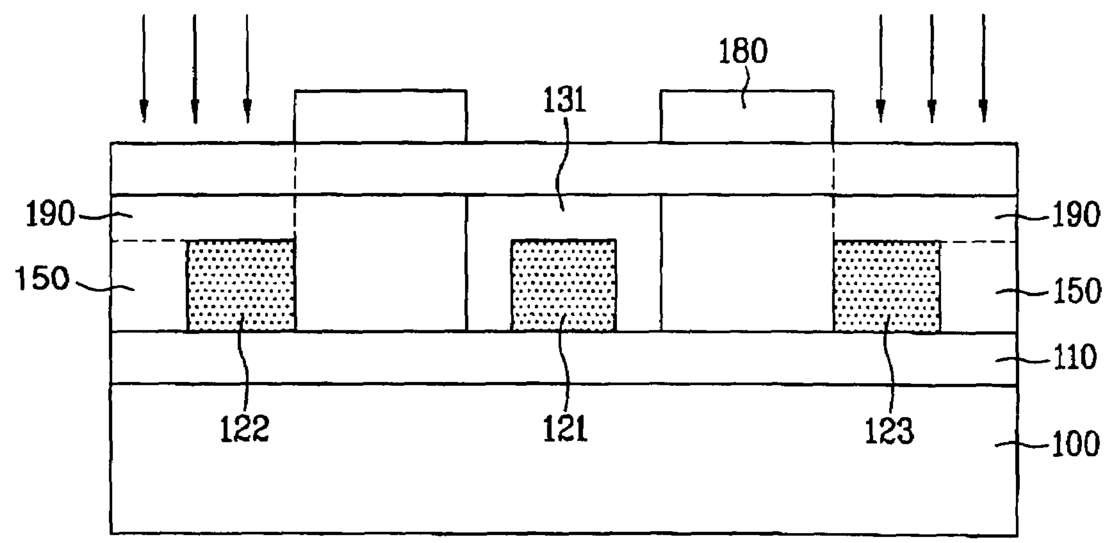

As shown in FIG. 3G, a second photoresist 180 can be coated onto the second polysilicon layer 170, and can be selectively patterned by exposing and developing processes to define source and drain regions.

Then, impurity ions for the source and drain can be implanted into the second polysilicon layer 170 and the first polysilicon layer 150, using the patterned second photoresist 180 as a mask, to form source and drain impurity regions 190.

Figure 3H:
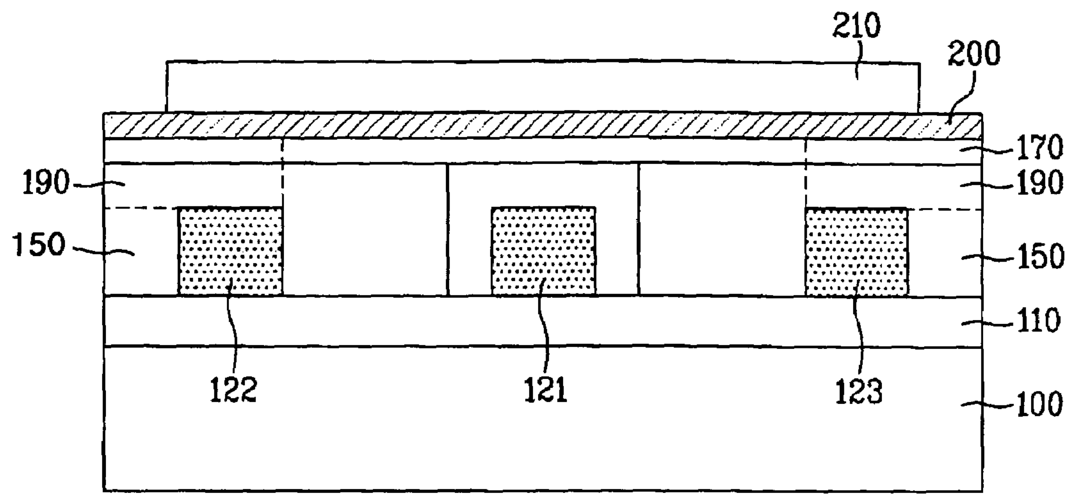

As shown in FIG. 3H, once the second photoresist 180 is removed, a high melting point metal layer can be deposited on the second polysilicon layer 170. Then, a thermal process can be performed thereon so that metal ions of the high melting point metal layer react with silicon ions of the second polysilicon layer 170 to form a metal silicide layer 200

In a specific embodiment, the high melting point metal layer can be formed by depositing a metal such as cobalt, nickel, titanium, tungsten, tantalum, or molybdenum by a physical vapor deposition (PVD) or chemical vapor deposition (CVD) method.

Then, an insulating material such as an oxide layer or a nitride layer can be deposited on the metal silicide layer 200 to form a second hard mask layer 210.

The second hard mask layer 210 can be formed by selectively removing the oxide layer or nitride layer through a photolithography process to remain on a region above the gate electrode 121, the source electrode 122, and the drain electrode 123.

Figure 3I:
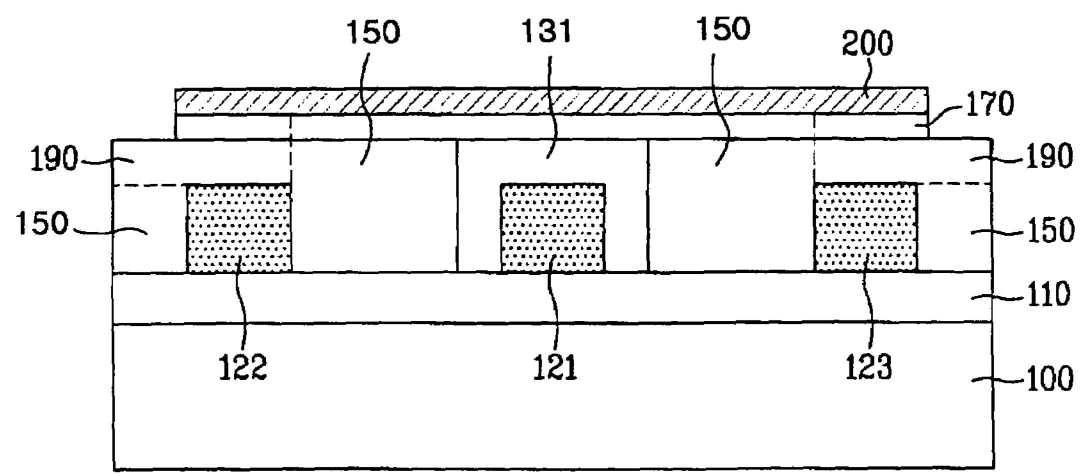

As shown in FIG. 3I, the exposed metal silicide layer 200 can be selectively removed using the second hard mask layer 210 as a mask.

Then, the second hard mask layer 210 can be removed and subsequent processes can be performed.

A semiconductor device and a method of fabricating the same configured as described above according to the present invention can have the following effects.

The layer formed by adding carbon to poly-germanium (poly-Ge) can be used as the channel layer of a device. Moreover, the size of the energy band gap can be varied according to the amount of added carbon. In addition, dopants can be activated in poly-germanium-carbon easier than in polysilicon, thereby preventing gate depletion and impurity diffusion and thus allowing integration of the device.

Also, a $Ge_{1-X}C_X$ epitaxial layer of group 4 alloys can be formed to serve as a base at the time of fabrication for various devices including MOS, HBT, FET, and a photo detector. For this reason, the energy band gap can be varied according to the amount of added carbon in order to activate dopants and reduce gate depletion.

It will be apparent to those skilled in the art that various modifications and variations can be made in the present invention. Thus, it is intended that the present invention covers the modifications and variations of this invention provided they come within the scope of the appended claims and their equivalents.

I claim:

1. A semiconductor device comprising:

an alloy layer formed on a substrate;

a gate electrode, a source electrode, and a drain electrode formed on the alloy layer at predetermined intervals therebetween;

a gate insulating layer formed on the gate electrode;

a first conductive layer formed on the substrate, the source electrode, and the drain electrode;

source and drain impurity regions formed in the first conductive layer and the second conductive layer on the source electrode and the drain electrode; and a second conductive layer and a metal silicide layer sequentially stacked on the first conductive layer, wherein the metal silicide layer covers a region above the gate electrode, the source electrode, and the drain electrode.

2. The semiconductor device of claim 1, wherein the alloy layer is formed of a material having carbon.

3. The semiconductor device of claim 2, wherein the alloy layer is formed of poly-germanium-carbon.

4. The semiconductor device of claim 1, wherein the gate insulating layer is formed of a high-K dielectric layer.

5. The semiconductor device of claim 1, wherein the metal silicide layer is formed of tungsten silicide, cobalt silicide, titanium silicide, or tantalum silicide.

6. The semiconductor device of claim 1, wherein the first conductive layer and the second conductive layer are formed of polysilicon.

7. The semiconductor device of claim 1, wherein the first conductive layer is formed to a height as high as a top surface of the gate insulating layer.

8. The semiconductor device of claim 1, wherein the second conductive layer covers a region above the gate electrode, the source electrode, and the drain electrode.

9. The semiconductor device of claim 1, wherein the gate electrode, the source electrode, and the drain electrode are formed of aluminum (Al), aluminum alloy (AlNd), Chrome (Cr) or molybdenum (Mo).

10. A method of fabricating a semiconductor device, the method comprising:

forming a poly-germanium-carbon alloy layer on a substrate;

forming a source electrode, a drain electrode, and a gate electrode on the alloy layer at predetermined intervals therebetween;

forming a gate insulating layer on a surface of the gate electrode;

forming a first conductive layer on the substrate, the gate insulating layer, the source electrode, and the drain electrode;

planarizing the first conductive layer to expose a top surface of the gate insulating layer;

forming a second conductive layer above the substrate;

selectively forming source and drain impurity regions in the first and second conductive layers; and forming a metal silicide layer on the second conductive layer;

the method further comprising varying the size of the energy band gap of the poly-germanium-carbon layer by adjusting the amount of carbon added to poly-germanium of the poly-germanium-carbon alloy layer.

11. The method of claim 10, further comprising:

performing a channel ion implantation in the first conductive layer.

12. The method of claim 10, wherein forming a gate insulating layer on a surface of the gate electrode comprises:

depositing a high-K dielectric layer on the entire substrate, including the source electrode, drain electrode, and gate electrode; and selectively removing the high-K dielectric layer using a first hard mask.

13. The method of claim 12, wherein the high-K dielectric layer remains only on the gate electrode and a peripheral region around the gate electrode.

14. The method of claim 10, further comprising:

selectively removing the metal silicide layer using a second hard mask.

15. The method of claim 10, wherein the second conductive layer covers a region above the gate electrode, the source electrode, and the drain electrode.

* * * * *